US009368198B1

(12) United States Patent
Kamalanathan et al.

(10) Patent No.: US 9,368,198 B1
(45) Date of Patent: Jun. 14, 2016

(54) CIRCUITS AND METHODS FOR PLACING PROGRAMMABLE IMPEDANCE MEMORY ELEMENTS IN HIGH IMPEDANCE STATES

(71) Applicants: Deepak Kamalanathan, Santa Clara, CA (US); Juan Pablo Saenz Echeverry, Mountain View, CA (US); Venkatesh P. Gopinath, Fremont, CA (US)

(72) Inventors: Deepak Kamalanathan, Santa Clara, CA (US); Juan Pablo Saenz Echeverry, Mountain View, CA (US); Venkatesh P. Gopinath, Fremont, CA (US)

(73) Assignee: Adesto Technologies Corporation, Sunnyvale, CA (US)

( * ) Notice: Subject to any disclaimer, the term of this patent is extended or adjusted under 35 U.S.C. 154(b) by 34 days.

(21) Appl. No.: 14/281,830

(22) Filed: May 19, 2014

Related U.S. Application Data

(63) Continuation of application No. 13/437,906, filed on Apr. 2, 2012, now Pat. No. 8,730,752.

(51) Int. Cl.
  *G11C 11/00* (2006.01)
  *G11C 13/00* (2006.01)
(52) U.S. Cl.
  CPC ........ *G11C 13/0011* (2013.01); *G11C 13/0097* (2013.01)

(58) Field of Classification Search
  CPC .................. G11C 13/0011; G11C 13/0097
  USPC ........................... 365/148, 63, 218
  See application file for complete search history.

(56) References Cited

U.S. PATENT DOCUMENTS

| | | | | |
|---|---|---|---|---|
| 6,873,540 | B2 * | 3/2005 | Krieger et al. | 365/151 |
| 7,215,568 | B2 * | 5/2007 | Liaw et al. | 365/148 |
| 7,772,614 | B2 * | 8/2010 | Pinnow | 257/154 |
| 7,869,253 | B2 * | 1/2011 | Liaw et al. | 365/148 |
| 8,045,362 | B2 * | 10/2011 | Maejima | 365/148 |
| 8,331,128 | B1 * | 12/2012 | Derhacobian et al. | 365/148 |
| 8,730,752 | B1 * | 5/2014 | Kamalanathan et al. | 365/226 |
| 9,007,808 | B1 * | 4/2015 | Dinh et al. | 365/148 |
| 2009/0244953 | A1 * | 10/2009 | Maejima | 365/148 |

OTHER PUBLICATIONS

U.S. Appl. No. 13/437,906, filed Apr. 2, 2012, parent to the present application.

* cited by examiner

Primary Examiner — Viet Q Nguyen

(57) ABSTRACT

A memory device can include a plurality of two terminal conductive bridging random access memory (CBRAM) type memory elements; at least one program transistor configured to enable a program current to flow through at least one memory element in response to the application of a program signal at its control terminal and a program bias voltage to the memory element; and an erase load circuit that includes at least one two-terminal diode-like load element, the erase load circuit configured to enable an erase current to flow through the load element and at least one memory element in a direction opposite to that of the program current.

20 Claims, 9 Drawing Sheets (BACKGROUND)

(BACKGROUND)

US 9,368,198 B1

CIRCUITS AND METHODS FOR PLACING PROGRAMMABLE IMPEDANCE MEMORY ELEMENTS IN HIGH IMPEDANCE STATES

CROSS REFERENCE TO RELATED APPLICATIONS

This application is a continuation of U.S. patent application Ser. No. 13/437,906 filed on Apr. 2, 2012, the contents of which are incorporated by reference herein.

TECHNICAL FIELD

The present disclosure relates generally to memory devices, and more particularly to memory devices having elements programmable between two or more impedance states.

BACKGROUND

FIGS. 15A and 15B show a conventional memory device 1500 having an access transistor 1502 and a conductive bridging random access memory (CBRAM) type memory element 1501 (also sometimes called a programmable metallization cell (PMC)). Access transistor 1503 is an n-channel metal-oxide-semiconductor (MOS) type transistor. A memory element 1501 is a two terminal element having a solid electrolyte formed between an anode 1505-0 and a cathode 1505-1.

FIG. 15A shows a conventional programming operation that places element 1501 into a low resistance state. Access transistor 1503 has a source at 0V (which may also be a bit line voltage, VBL), a body at 0V (Vsub=0V), and a gate (which may also be a word line voltage (VWL)) that receives a select voltage Vgs, which is greater than a threshold voltage (Vtn) of the transistor. The anode of element 1501 is biased to a positive program voltage (Vprog). As a result, a program current (Iprog) flows through the element 1501 in the direction from the anode 1505-0 to the cathode 1505-1. Within element 1501, metal atoms from the anode can oxidize and create a conductive path (i.e., filament) through a solid electrolyte layer, thereby lowering a resistance of the element 1501 (with respect to an erased state).

FIG. 15B shows a conventional erase operation that places element 1501 into a high resistance state. Access transistor 1503 has a drain at a positive erase voltage (Verase) (which may also be a bit line voltage, VBL), a body at 0V, and a gate that receives a high power supply voltage VDD. The anode of element 1501 is biased to 0V. As a result, an erase current (Ierase) flows through the element 1501 in the direction from the cathode 1505-1 to the anode 1505-0. Within element 1501, metal atoms making up any filament can oxidize, dissolving the filament, thereby increasing the resistance of the element 1501 (with respect to the programmed state).

A drawback to the conventional erase operation of FIG. 15B can be limits in erase current provided to the element 1501. More particularly, in the erase operation shown, access transistor 1503 will introduce a threshold voltage drop (Vtn), reducing the current conduction capability of the transistor as compared to the program operation (shown in FIG. 15A). One way of increasing a maximum current provided by an access transistor 1503 can be to increase the voltage applied at its gate. However, providing such a boosted voltage can require a new power supply source and/or a boosting voltage generator/charge pump(s) and/or cause reliability problems in the access transistor. Further, such an approach adds to the overall erase operation complexity, as an erase operation cannot be controlled only by a transistor source voltage (i.e., the bit line voltage, VBL).

Still further, in some conventional devices, as access transistor sizes are reduced, they may not provide sufficient erase current to erase "strongly programmed" element. Further, erase resistance values can have a wide distribution, and a conventional transistor erase approach (i.e., that shown in FIG. 15B) provides an insufficient range of erase voltages across the element to control erase resistance values.

DETAILED DESCRIPTION

Figure 1A:
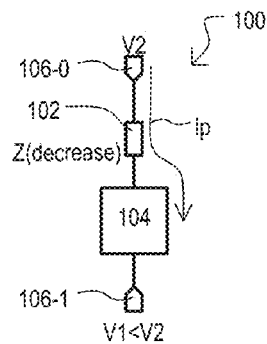
FIGS. 1A and 1B are block schematic diagrams of program and erase operations of a memory device, according to an embodiment.

Embodiments disclosed herein show devices and methods directed to programmable impedance elements that can be programmed between low and high impedance states. In erase operations, biasing and load conditions and ensure that an erase current increases as an erase voltage increases. In particular embodiments, memory devices having conductive bridging random access memory (CBRAM) type elements can be erased to two or more high resistance states having higher data retention times than lower resistance programmed states. In a very particular embodiment, a memory device can have CBRAM type elements programmable to three or more resistance levels, with at least two resistance levels being high resistance states (which can be between 100 kohms and 10 Gohms).

In this disclosure, operations that place an element in a lower impedance state will be referred to as programming operations, and the lower impedance state referred to as the "programmed" state. Operations that place an element into one or more higher impedance states will be referred to as erase operations, and the higher impedance states referred to as erase states. However, this is just a naming convention. As noted above, in very particular embodiments, programmed states can have a resistance of less than about 100 kohms, while erased states can have a resistance of greater than 100 kohms.

In the embodiments below, like sections are referred to by the same reference character but with the leading digit(s) corresponding to the figure number.

Figure 1B:
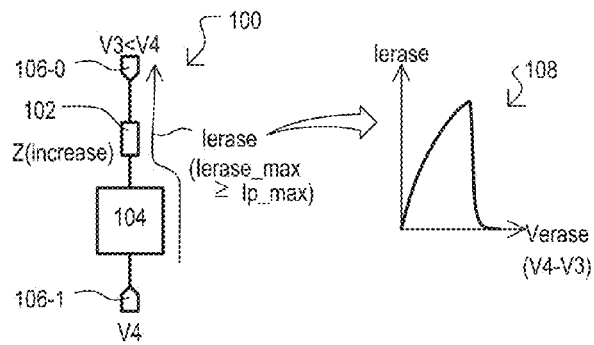

Referring to FIGS. 1A and 1B, a memory device 100 according to one embodiment is shown in a block schematic diagram. A memory device 100 can include an element 102 and a load circuit 104 connected in series between bias nodes 106-0 and 106-1. An element 102 can be reversibly programmed between two or more impedance states by application of bias voltages that result in a current flowing through the element. A load circuit 104 can provide a load for controlling a current flowing through element 102 when bias voltages are applied across bias nodes 106-0/1.

FIG. 1A shows a program operation according to one embodiment. A bias voltage can be applied across element 102 and load circuit 104 by application of a voltage V2 at bias node 106-0 and a voltage V1 at bias node 106-1. Consequently, a program current Ip can flow through element 102. An impedance of element (Z) can decrease, if the element 102 was previously in a higher impedance state. It is noted that a program current Ip can reach a maximum value Ip_max FIG. 1B shows an erase operation according to one embodiment. A bias voltage can be applied across element 102 and load circuit 104 that is opposite to that of the program operation. In the embodiment shown, a voltage V3 can be applied at bias node 106-0 and a voltage V4 can be applied at bias node 106-1. Consequently, an erase current Ierase can flow through element 102 in a direction opposite to that of the program current Ip. An impedance of element (Z) can increase, if the element 102 was previously in a lower impedance state.

Referring still to FIG. 1B, by operation of element 102 in conjunction with load circuit 104, an erase current Ierase can have particular features that can differ from conventional approaches. As shown, a maximum erase current (Ierase_max) can have a magnitude no less than a maximum program current (Ip_max). Thus, current magnitudes in erase operations can equal or surpass those in program operations, which may ensure programmed states can be adequately reversed.

Additional features of an erase current according to a particular embodiment are shown by graph 108. Graph 108 shows an erase current versus an erase voltage as an element is erased to a higher impedance state. As shown, an erase current (Ierase) can vary as an erase voltage (Verase) varies. More particularly, an erase current (Ierase) can increase as an erase voltage (Verase) increases. In such an arrangement, an erase voltage (Verase) can be used to modulate an erase current, and hence, modulate an erase impedance.

As also shown by graph 108, an erase operation can result in a self-limiting erase current. As shown, once a voltage reaches a predetermined limit, it can automatically fall to a low (e.g., substantially zero) level. An automatic current limiting can be one that occurs without the application of a control signal separate from the applied bias voltage Verase.

In one embodiment, a load circuit 104 can have an inherent threshold voltage. If a voltage across the load circuit 104 exceeds the threshold voltage, an erase current can be allowed to flow through element 102. However, once a voltage across the load circuit 104 falls below the threshold voltage, an erase current can fall to essentially zero. In one embodiment, upon application of an erase voltage (Verase) across an element 102 and load circuit 104, if the element is in a low impedance state, the threshold voltage of the load circuit 104 can be exceeded, and an erase current can flow, and the impedance of the element can increase. At one point, an element impedance can be sufficient large enough, that a voltage across the load circuit 104 falls to less than the threshold voltage. At this point, load circuit 104 can stop conducting, and an erase current can fall to essentially zero.

In some very particular embodiments, a load circuit 104 can include an active device, such as a transistor, including an insulated gate field effect (e.g., MOS) type transistor, a bipolar junction transistor (BJT) or a junction field effect transistor (JFET). In still other embodiments, a load circuit can include a diode or thyristor type device.

Figure 2A:
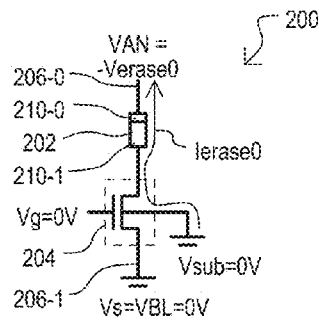
FIGS. 2A and 2B are block schematic diagrams of a memory device and erase operations, according to an embodiment.
Figure 2B:
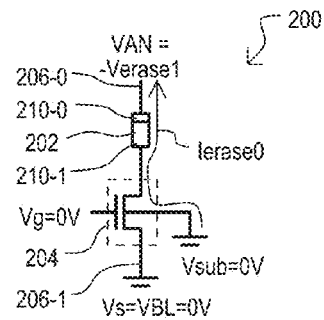

Referring to FIGS. 2A and 2B, a memory device 200 and operations according to one embodiment are shown in block schematic diagrams. A memory device 200 can include features like those of FIGS. 1A and 1B. In one very particular embodiment, memory device 200 can be on particular implementation of that shown in FIGS. 1A/B.

FIGS. 2A/2B differ from FIGS. 1A/B in that a load circuit 204 can include a metal-oxide-semiconductor (MOS) type transistor, and an element 202 can be a CBRAM type element. It is noted that a MOS type transistor can be any suitable insulated gate field effect transistor, and is not intended to be limited to a particular gate material or gate insulator material. In the embodiment shown, a transistor 204 can be an n-channel transistor. A CBRAM type element can include one or more solid electrolyte layers formed between an anode 210-0 and a cathode 210-1.

Figure 15A:
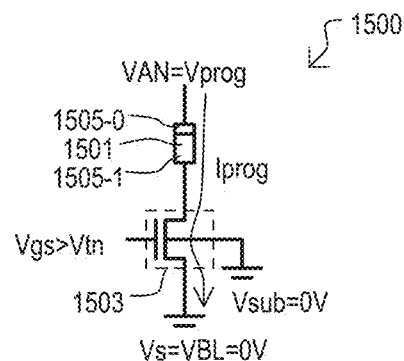
FIGS. 15A and 15B are schematic diagrams of a conventional memory device and operations.

In one very particular embodiment, a memory device 200 can program an element 202 (i.e., place it in a low resistance state) in a conventional fashion, like that shown in FIG. 15A. Further, a transistor 204 can be an access transistor that can provide a read current path between element 202 and a read circuit (e.g., current sensing circuit).

Figure 15B:
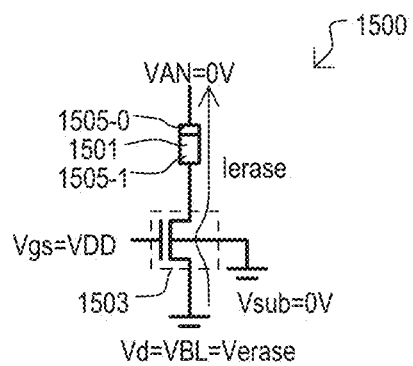

In contrast, however, a memory device 200 can erase element 202 in a different manner than that shown in FIG. 15B. FIGS. 2A and 2B show two different erase operations, capable of placing element 202 into two different erase resistance states.

Referring to FIG. 2A, in the erase operation shown, transistor 204 can have a source connected to 0V (which may also be a bit line voltage VBL), a gate connected to 0V, and a body (Vsub) connected to 0V. An anode 210-0 of element 202 can be biased to a negative erase voltage −Verase0. As a result, the p-n junction formed by the drain-body interface can forward bias, and an erase current (Ierase0) can flow through element 202 increasing its resistance to a first erase resistance Rerase0. This is in sharp contrast to the erase operation shown in FIG. 15B, in which an erase current flows through a transistor channel, from drain to source.

Referring to FIG. 2B, another erase operation is shown, having biasing like that of FIG. 2A, but with an anode voltage being −Verase1 (which is different than −Verase0). An increase in the resistance of element 202 can occur, but with the element being erased to a second erase resistance Rerase1, which is different than Rerase0. That is, by application of different anode voltages only (i.e., with no change to gate, source, body voltages of transistors 204) an element resistance 202 can modulated.

The erase operations shown in FIGS. 2A/B are referred to herein as "diode" erase operations, as the source-body p-n junction of the access transistor 204 forms a diode. The conventional erase operation shown in FIG. 15B will be referred to herein as a "transistor" erase operation.

Figure 3A:
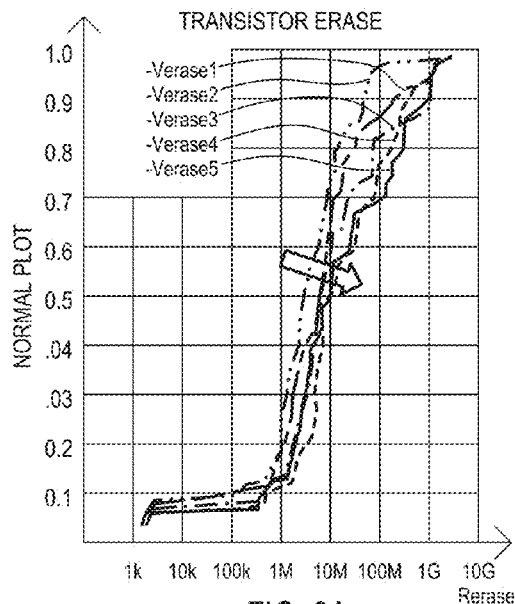
FIGS. 3A to 3D are graphs showing how an erase voltage can modulate an erase resistance according to an embodiment, as compared to a conventional approach.
Figure 3B:
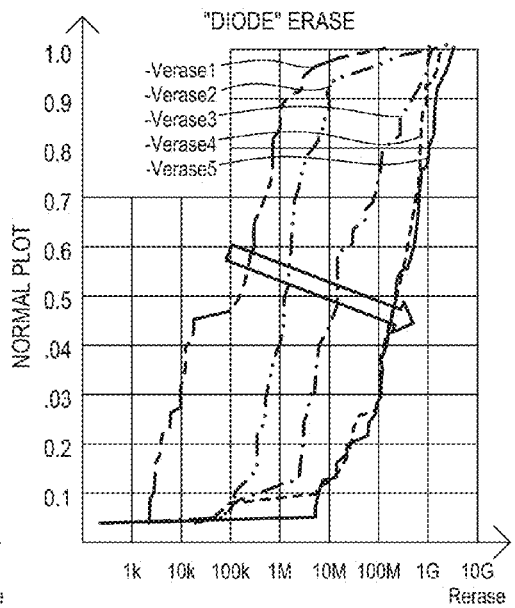
Figure 3C:
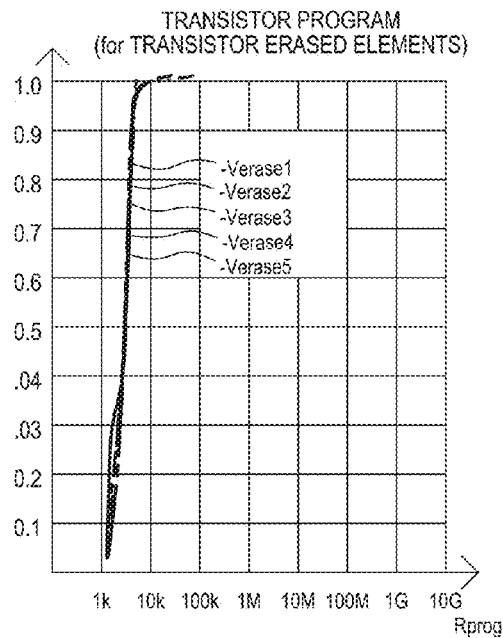

FIGS. 3A to 3C are graphs showing experimental results for understanding erase operations according to embodiments. FIGS. 3A and 3B are normal probability plots for erase resistances achieved by application of five different erase voltages (−Verase1 to −Verase5) between −1.5 and −3V. It is understood that the magnitudes of such voltages are increasing (i.e., magnitude of −Verase1<−Verase2<−Verase3<−Verase4<−Verase5). FIG. 3A shows a conventional transistor erase operation like that shown in FIG. 15B. FIG. 3B shows a diode erase operation, like that shown by FIGS. 2A/B.

FIGS. 3A and 3B shows how in diode erase operations, an applied erase voltage Verase can significantly modulate erase resistance values as compared to transistor erase operations. As shown, greater difference in erase resistance (Rerase) can be achieved with diode erase operations as compared to transistor erase operations.

As will be shown in FIGS. 3C and 3D below, the erase results of FIGS. 3A and 3B are from elements programmed in an identical fashion. Further, the two erase results use a same applied erase voltages (−Verase1 to −Verase5), but arrive at substantial differences in erase resistance.

It is understood that diode erase operations as shown in FIGS. 3A/B can be self-limiting. As an element erases, the voltage across the body-drain p-n junction decreases. Once the voltage falls below a diode threshold voltage (Vtdiode), the erase current can self-terminate.

FIG. 3C shows a normal probability plot for a conventional program operation like that of FIG. 15A. For the various applied program voltages, elements can be programmed to program resistance Rprog. The labels show devices corresponding to those of FIG. 3A (by the erase voltage in a subsequent erase operation).

Figure 3D:
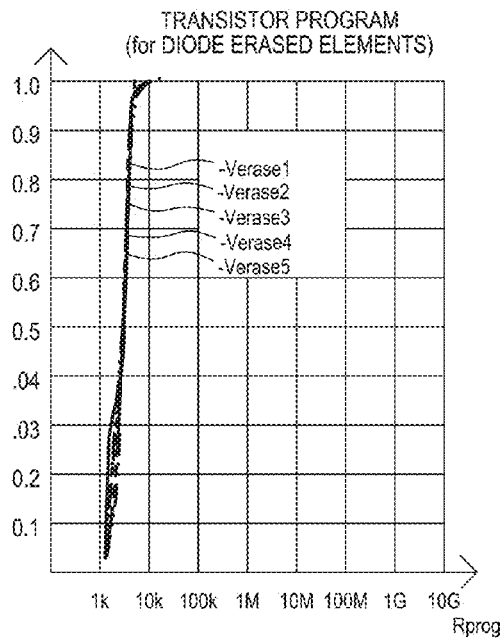

FIG. 3D shows a normal probability plot for a program operation like that of FIG. 15A but for the devices shown in FIG. 3B. As in the case of FIG. 3C, the labels show devices corresponding to those of FIG. 3B (by the erase voltage in a subsequent erase operation). From FIGS. 3A to 3D it is understood that devices programmed to low resistance states in a substantially identical fashion can be erased to substantially different states using diode erase type operations.

In some embodiments, an element can be a multi-level element (i.e., can stores more than two values), and can be programmed to a relatively low resistance as shown in FIG. 3C, and then erased to two or more relatively high resistances, as shown in FIG. 3B.

In still other embodiments, an element can be a binary element (stores two data values), by either being programmed to a low resistance state, or erased to a high resistance state, as shown in FIG. 3B.

In still other embodiments, an element can be a multi-level or binary element that does not include a programmed (e.g., low resistance state), being erased to any of multiple high resistances, as shown in FIG. 3B.

Figure 4:
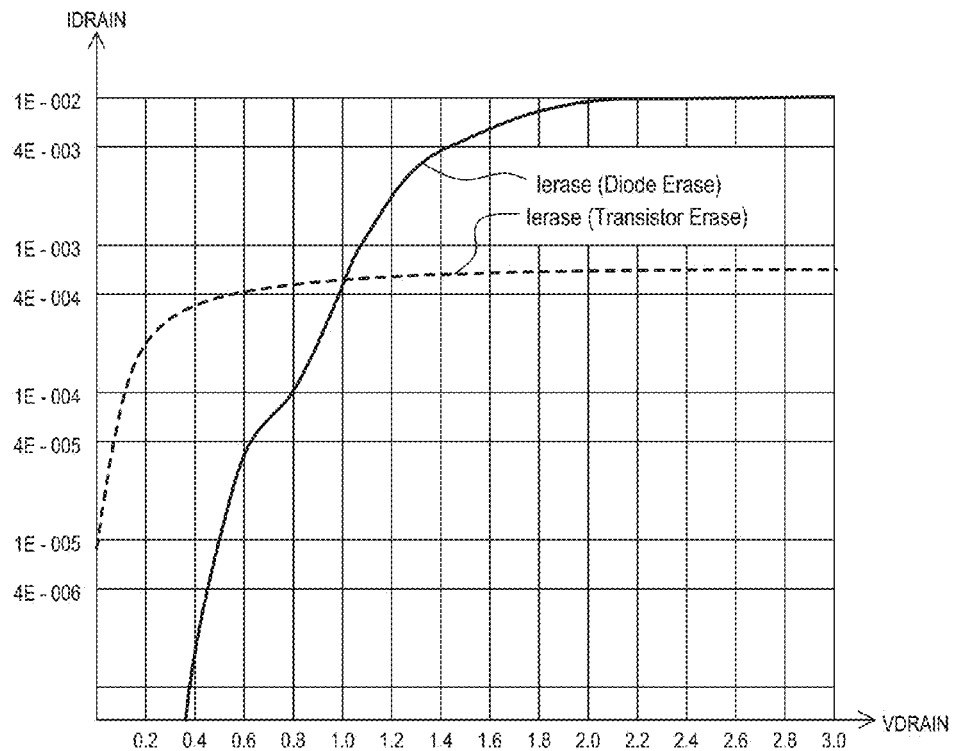
FIG. 4 is a graph showing how an erase current according to an embodiment can differ from that of a conventional approach.

FIG. 4 is a graph showing a comparison of erase currents between a conventional transistor erase operation (Ierase (Transistor Erase)) and a diode erase operation (Ierase (Transistor Erase)). As shown, in the transistor erase case, an erase current can rise, but then remain at a saturation level. In contrast, in the diode erase operation, an erase current can rise exponentially (until limited by an external compliance requirement). As a result, as compared to the transistor erase case, for a same applied anode voltage (VAN), a diode erase operation can allow more current to flow for a higher erase resistance (Rerase) and a higher applied voltage across the element.

Further, as noted previously, a diode erase operation can allow for greater modulation of erase current by erase voltage as compared to transistor erase. More particularly, in the transistor erase case, in the triode region (i.e., up to about 0.5 VDRAIN), a current voltage relationship can have the well-known linear response, but then follow a constant current once saturation is reached. In sharp contrast, in a diode erase, a current can follow a diode voltage (i.e., $I=K*e^v$), where K is a constant and V is a voltage greater than the threshold voltage of the diode.

Figure 5A:
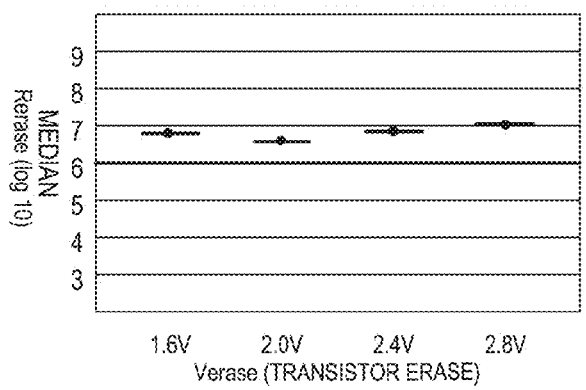
FIGS. 5A and 5B are additional graphs showing how an erase voltage can modulate an erase resistance according to an embodiment, as compared to a conventional approach.
Figure 5B:
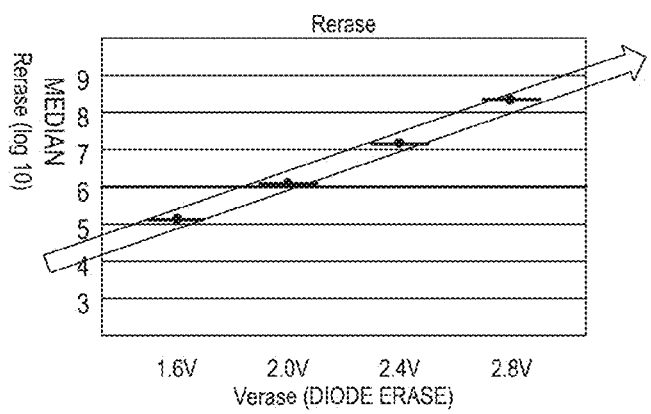

FIGS. 5A and 5B are graphs showing additional experimental results for understanding erase operations according to embodiments. FIGS. 5A and 5B are graphs showing a median erase resistance (Rerase) for four different erase voltages between 1.5 and 3V. FIG. 5A shows a conventional transistor erase operation like that shown in FIG. 15B. FIG. 5B shows a diode erase operation, like that shown by FIGS. 2A/B.

FIGS. 5A and 5B shows how diode erase operations can provide for a modulation in erase resistance according to an erase voltage. In contrast, conventional transistor erase operations provide little variation in erase resistance. Accordingly, an erase voltage in a diode erase operation can be varied to arrive at different erase resistance levels.

Figure 6:
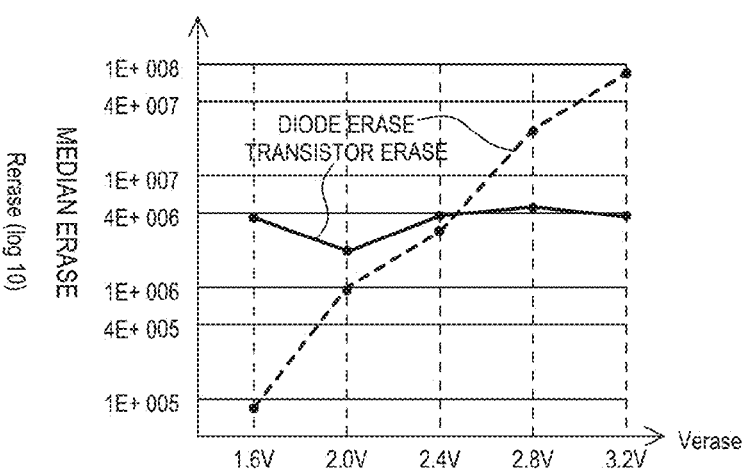
FIG. 6 is a further graph showing how an erase voltage can modulate an erase resistance according to an embodiment, as compared to a conventional approach.

FIG. 6 is another graph demonstrating erase resistance modulation using an erase voltage. FIG. 6 is a graph showing median erase resistance values for five different erase voltages of 1.6 V, 2.0 V, 2.4 V, 2.8 V and 3.2 V. FIG. 6 shows results for a conventional transistor erase versus a diode erase. As in the case of FIGS. 5A/B, FIG. 6 shows that an erase voltage in a diode erase operation can be varied to arrive at far greater differences in erase resistance levels, as compared to transistor erase operations.

While erase operations according to embodiments can provide for multiple erase resistance levels, such operations can also provide for tighter resistance distributions than conventional transistor erase operations.

Figure 7:
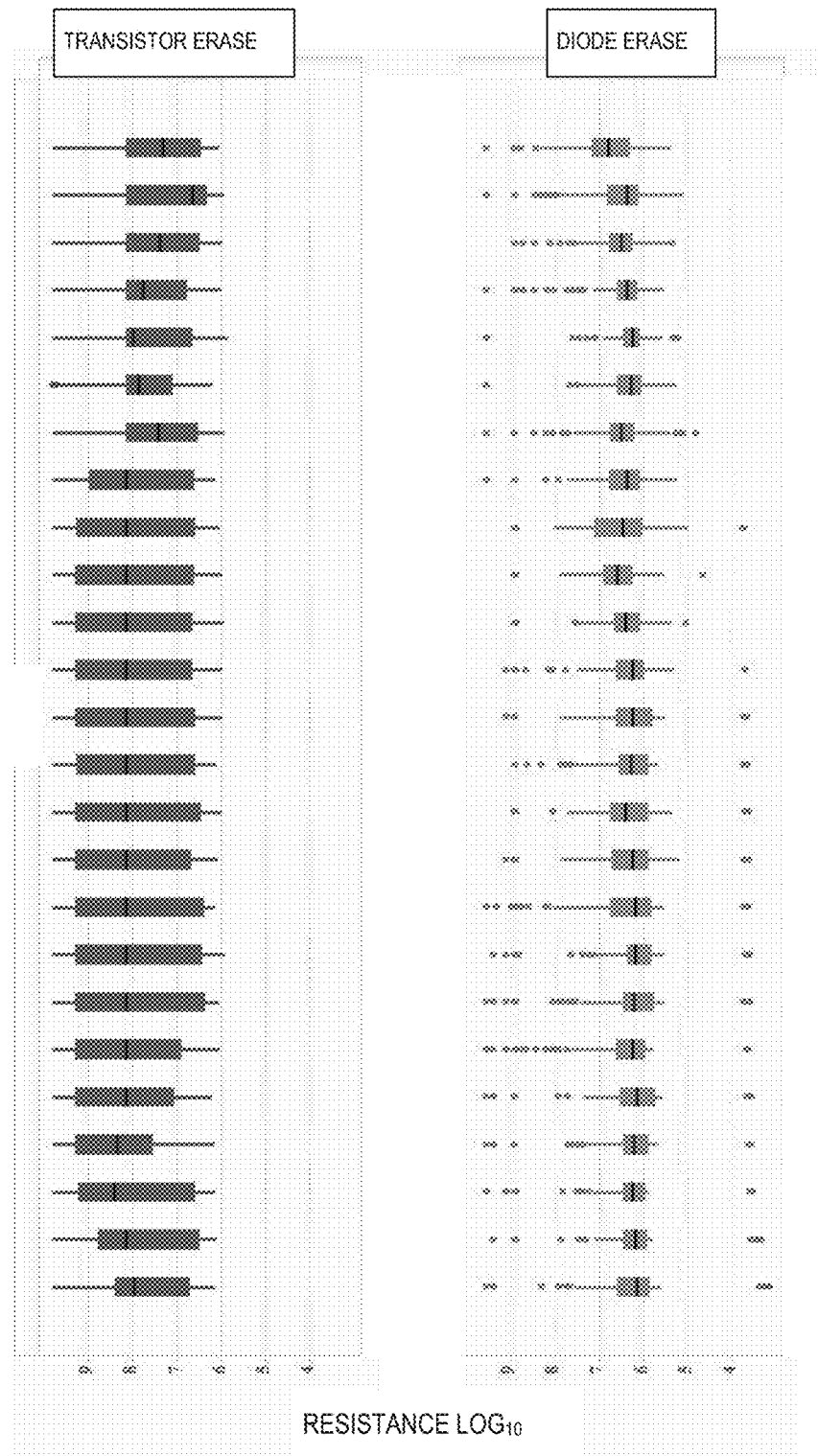
FIG. 7 is a graph showing how an erase operation according to an embodiment can provide a tighter erase resistance distribution as compared to a conventional approach.

FIG. 7 is a graph showing erase resistances results comparing erase resistance distributions for CBRAM elements erased via transistor erase (TRANSISTOR ERASE) and via diode erase (DIODE ERASE). FIG. 7 shows erase resistances for CBRAM elements programmed with a program voltage (Vprog) of 1.0 V and an erase voltage of 1.6 V for 500 cycles (sampled every 20 cycles). As shown, resistance distributions for the diode erase elements are tighter than that of the transistor erase elements.

While embodiments above have shown memory devices with access transistors that can have p-n junctions that are forward biased to create an erase load, other embodiments can include one or more controllable current paths separate from a programming path through an access device. Particular embodiments having such separate erase current paths will now be described.

Figure 8A:
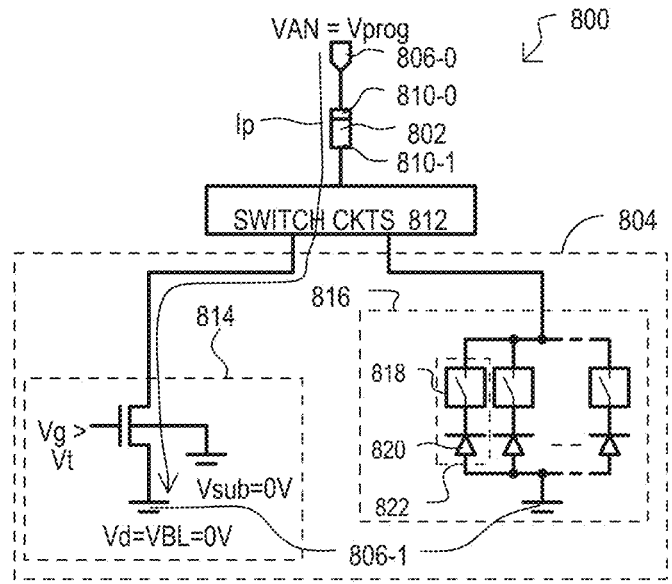
FIGS. 8A and 8B are block schematic diagrams of a memory device according to another embodiment.
Figure 8B:
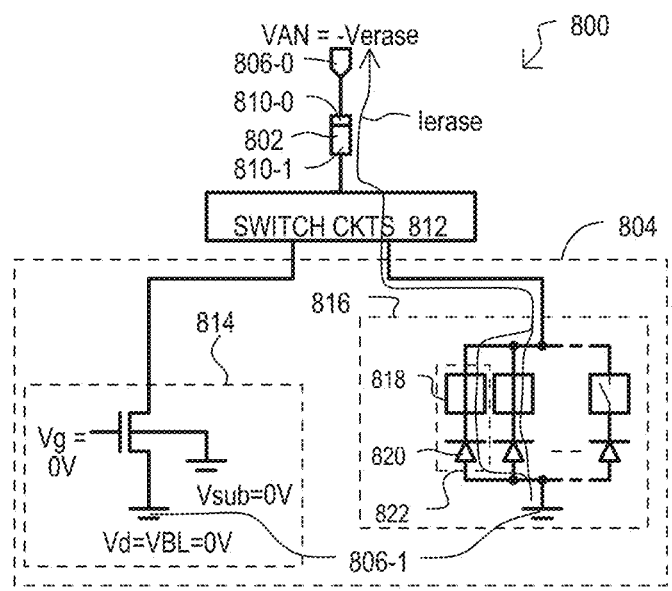

Referring to FIGS. 8A and 8B, a memory device 800 according to another embodiment is shown in a block schematic diagram. A memory device 800 can include an element 802, switch circuits 812, and a load circuit 804. In the very particular embodiment shown, an element 802 can be a CBRAM type element having an anode 810-0 and a cathode

810-1. An anode 810-0 can be connected to a first bias node 806-0, and a cathode 810-1 can be connected to switch circuits 812.

A load circuit 804 can include a program load 814 and an erase load 816. A program load 814 can be a MOS type transistor, like that shown in FIGS. 2A/B, having a source connected to a second bias node 806-1 and a drain connected to switch circuits 812. In a particular embodiment, such a MOS type transistor can be an access transistor that connects an element 802 (by way of switch circuits) to a bit line connected at its drain.

An erase load 816 can include a number of erase load sections (one shown as 822) arranged in parallel between switch circuits 812 and second bias node 806-1. Each erase load section 822 can be enabled to provide an erase current path. Thus, the greater the number of enabled erase load sections, the larger the erase current. In the very particular embodiment shown in FIGS. 8A/B, each erase load section 822 can include a switch element (one shown as 818) and a diode element (one shown as 820).

FIG. 8A shows a programming operation that can lower a resistance of element 802. In a programming operation, switch circuits 812 can connect program load 814 to element 802, while a program bias voltage (Vprog) is applied across bias nodes 806-0/1. Switch circuits 812 can also isolate erase load 816 from the element. In the very particular embodiment shown, program load 814 can include an access transistor biased in the same manner as FIG. 2A. Consequently, a program current Ip can flow through element 802 via a channel of the access transistor.

FIG. 8B shows an erase operation that can increase a resistance of element 802. In an erase operation, switch circuits 812 can connect erase load 816 to element 802, while an erase bias voltage (−Verase) is applied across bias nodes 806-0/1. Optionally, switch circuits 812 can isolate program load 814 from element 802. Within erase load 816 a number of switch elements 818 can be enabled according to a desired erase current Ierase. With the application of erase bias voltage −Verase, diodes 820 corresponding to enabled switch elements 818 can be forward biased and provide a voltage-modulated and self-limiting current as described above. It is understood that different numbers of erase load sections 822 can be enabled for different erase resistance values.

Figure 9:
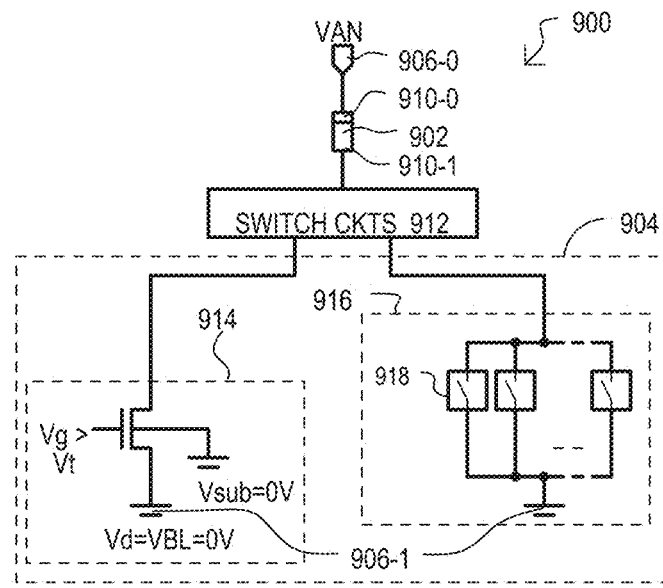
FIG. 9 is a block schematic diagram of a memory device according to another embodiment.

Referring to FIG. 9, a memory device 900 according to another embodiment is shown in a block schematic diagram. Memory device 900 includes items like that of FIGS. 8A/B, and such like items can operate in the same, or an equivalent manner.

FIG. 9 differs from FIGS. 9 A/B, in that erase load 916 can include erase load sections 918 with switch elements, but not diode elements.

Figure 10:
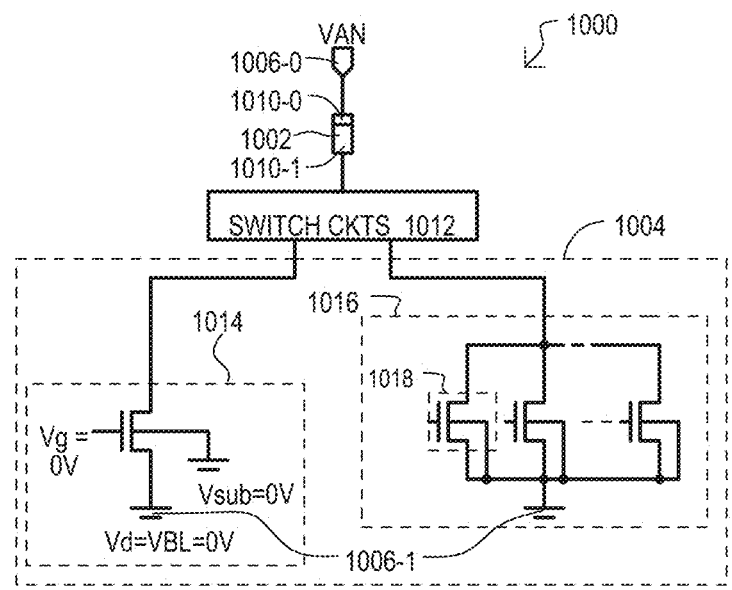
FIG. 10 is a block schematic diagram of a memory device according to another embodiment.

Referring to FIG. 10, a memory device 1000 according to a further embodiment is shown in a block schematic diagram. Memory device 1000 includes sections like that of FIG. 9, and such like sections can operate in the same, or an equivalent manner. In one embodiment, a memory device 1000 can be one implementation of that shown in FIG. 9.

FIG. 10 differs from FIG. 9 in that erase load 1016 can include erase load sections 1018 formed of MOS type transistors. In some embodiments, the MOS type transistors can operate in a switch like fashion, being driven into saturation. In other embodiments, MOS type transistors can operate in a triode region of operation, for a more linear relationship between an applied erase voltage (Verase) and resulting erase current. In further embodiments, the MOS type transistors can operate in the manner shown in FIGS. 2A/B, having a forward biased drain-body p-n junction. Still further, in other embodiments, the MOS type transistors can operate in a "snapback" mode (described in more detail below).

Figure 11:
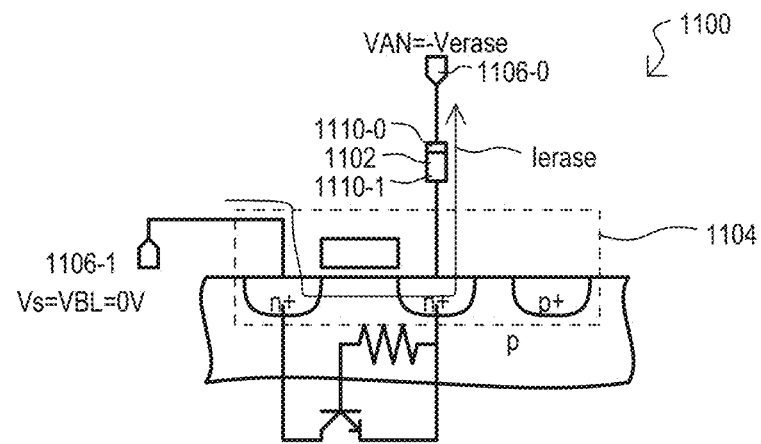
FIG. 11 is a diagram of a memory device having a transistor in a "snapback" mode of operation during an erase operation, according to an embodiment.

FIG. 11 shows another memory device an operation according to a further embodiment. FIG. 11 shows an arrangement like that of FIGS. 2A/B, however, the MOS transistor of load circuit 1104 is represented with a cross-sectional view. FIG. 11 shows an erase operation in which an erase current can be generated by a parasitic bipolar junction transistor (BJT) present in the MOS transistor structure. In such an arrangement, the erase current can be controlled by the substrate voltage of the MOS device, which is also the base voltage of the parasitic BJT.

In an erase operation, an erase voltage (−Verase) can be applied a first bias node 1106-0, while a second bias node 1106-1 is at a higher potential (0V in the embodiment shown). With application of a sufficiently large voltage difference between the bias nodes 1106-0/1, a MOS type device can "snapback" as a parasitic npn BJT is enabled. A current Ierase can flow through the parasitic BJT, and element 1102 can be erased as described in FIGS. 2A/B.

In particular embodiments, MOS device of load circuit 1104 can be an access device as noted for other embodiments, providing a path to a bit line, or the like, to enable reading of a resistance of element 1102.

Figure 12:
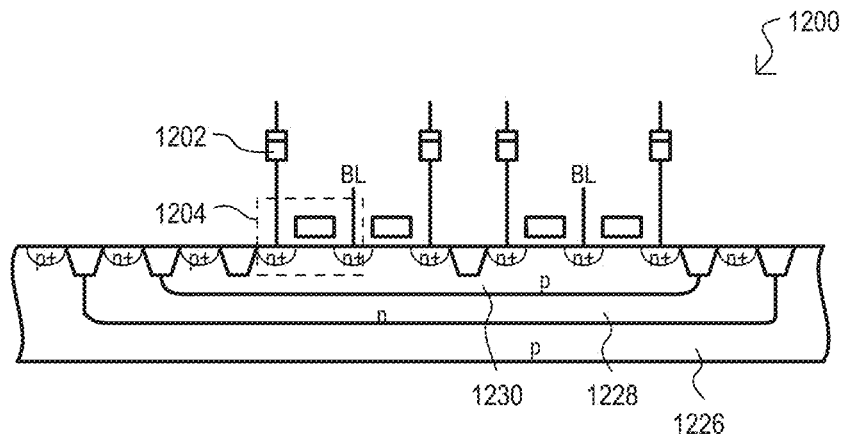
FIG. 12 is a side cross sectional view of a memory device having a triple well structure according to an embodiment.

FIG. 12 is a side cross sectional view showing a memory device 1200 according to another embodiment. Memory device 1200 can include elements (one labeled 1202) connected to MOS type transistors (one shown as 1204), as described for embodiments herein. MOS type transistors 1204 can be access devices, connecting elements 1202 to bit lines (BL).

FIG. 12 shows a "triple" well structure in which MOS type transistors 1204 can be formed in their own well. MOS type transistors 1204 can include a substrate 1226 doped to a first conductivity type (in this case p-type). A first well 1228 can be formed in the substrate 1226 that is doped to a second conductivity type (in this case n-type). A second well 1230 can be formed in the first well 1228 that is doped to the first conductivity type. MOS type transistors 1204 can be formed in the second well 1230.

In such an arrangement, sources of MOS type transistors 1204 can be biased to levels other than a power supply level. As but one example, in an erase operation like that shown in FIGS. 2A/B, sources of access transistors could be biased to a positive voltage, enabling a smaller magnitude −Verase voltage to be used.

Figure 13:
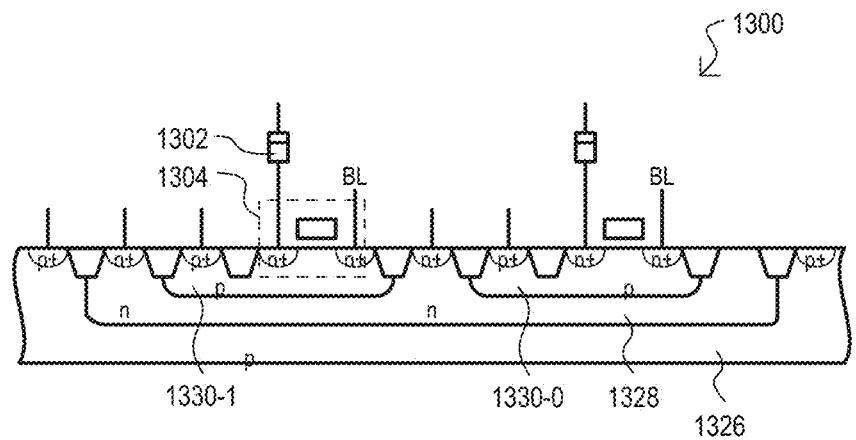
FIG. 13 is a side cross sectional view of a memory device having a triple well structure according to another embodiment.

FIG. 13 is a side cross sectional view showing a memory device 1300 according to a further embodiment. Memory device 1300 can include a triple well structure, like that of FIG. 12. FIG. 13 differs from FIG. 12 in that multiple second wells 1330-0/1 can be formed, each of which can include a MOS type transistor (one shown as 1304).

Arranging individual access devices, or groups of access devices into common wells, as shown in FIGS. 12 and 13, can enable selective erase of individual elements to different high impedance levels. Two particular examples of such embodiments are shown in FIGS. 14A and 14B.

Figure 14A:
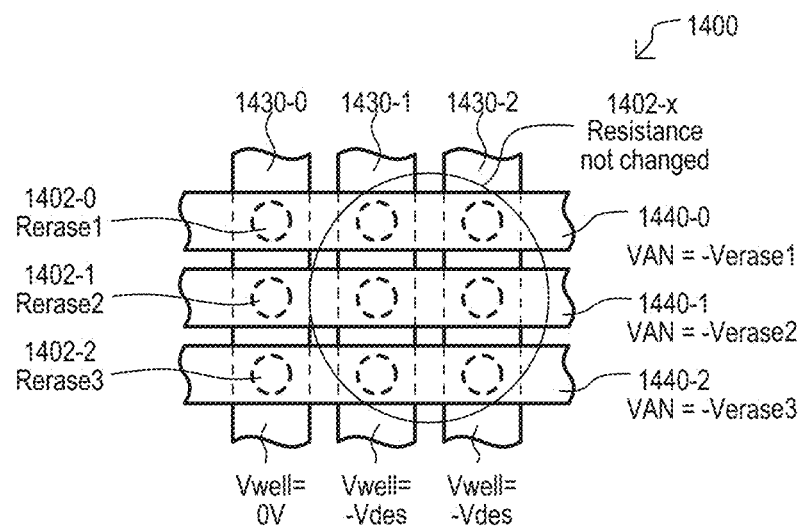
FIGS. 14A and 14B are top plan views of a memory device showing erase operations according to different embodiments.
Figure 14B:
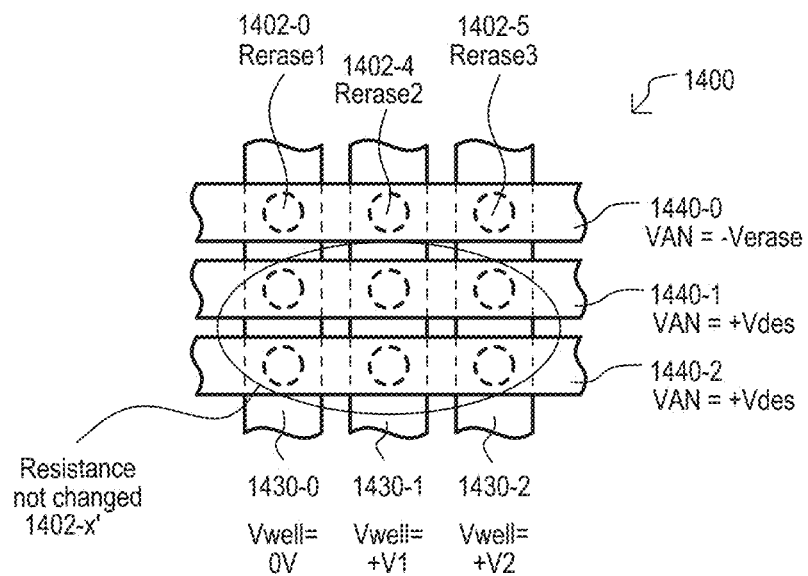

FIGS. 14A and 14B are top plan views of a memory device 1400 according to an embodiment. FIGS. 14A/B show a number of wells 1430-0 to -2, each of which can be connected to a group of memory elements as described herein, or equivalents. FIGS. 14A/B shows memory elements 1402-0 to -2 corresponding to well 1430-0. In some embodiments, wells (1430-0 to -2) can include access devices, such as transistors, for connecting elements (1402-0 to -2) to bit lines, or the like. FIGS. 14A/B also shows anode plates 1440-0 to -2, which can be connected to terminals of elements. For example, anode plates 1440-0 to -2 can be connected to elements 1402-0 to -2, respectively. Anode plates 1440-0 to -2 can select sets of elements that differ from the sets of elements selected by wells. In the particular embodiment shown, anode plates (1440-0 to -2) can select elements in a horizontal direction, while wells (1430-0 to -2) can select elements in a vertical direction.

FIG. 14A shows an erase operation that can erase a group of elements in the column direction. In the very particular embodiment shown, different erase bias voltages can be created across elements (1402-0 to -3), while the remaining elements 1402-x are "de-selected", by ensuring that voltages across the elements are not sufficient to change their impedance.

In the very particular embodiment shown, well 1430-0, corresponding to the elements to be erased, can be driven to a select voltage (0V, in the embodiment shown). At the same time, anode plates (1440-0 to -2) can be driven to erase voltages suitable for a desired erase state. In the example shown, it is assumed that each element (1402-0 to -2) is to be erased to a different resistance, thus anode plates (1440-0 to -2) are driven to different negative erase voltages (−Verase1, −Verase2, −Verase3). The de-selected wells 1430-1/2 can be driven to a negative de-select voltage (−Vdes), which can ensure voltages across de-selected elements 1402-x are not sufficient to erase such de-selected elements.

FIG. 14B shows an erase operation that can erase a group of elements in the row direction. In the very particular embodiment shown, anode plate 1440-0 can be driven to a select voltage (−Verase, in this embodiment), corresponding to the elements to be erased. At the same time, wells (1430-0 to -2) can be driven to different select voltages suitable for a desired erase state. In the example shown, it is assumed that each element (1402-0, -4, -5) is to be erased to a different resistance, thus wells (1430-0 to -2) can be driven to different voltages (0V, +V1, +V2). The de-selected anode lines 1440-1/2 can be driven to a positive de-select voltage (+Vdes), which can ensure that voltages across de-selected elements 1402-x' are not sufficient to erase such de-selected elements.

It should be appreciated that in the foregoing description of exemplary embodiments, various features are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

It is also understood that the embodiments of the invention may be practiced in the absence of an element and/or step not specifically disclosed. That is, an inventive feature of the invention can be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. A memory device, comprising:
a plurality of two terminal conductive bridging random access memory (CBRAM) type memory elements;
at least one program transistor configured to enable a program current to flow through at least one memory element in response to the application of a program signal at its control terminal and a program bias voltage to the memory element; and
an erase load circuit that includes at least one two-terminal diode-like load element, the erase load circuit configured to enable an erase current to flow through the load element and at least one memory element in a direction opposite to that of the program current.

2. The memory device of claim 1, wherein:
the at least one program transistor is selected from: an insulated gate field effect transistor with a gate as its control terminal, a junction field effect transistor with a gate as its control terminal, and a bipolar junction transistor with a base as its control terminal.

3. The memory device of claim 1, wherein:
the erase load circuit includes a plurality of load elements arranged in parallel with one another.

4. The memory device of claim 3, wherein:
the erase load circuit includes a plurality of load switches, each load switch being connected in series with one load element.

5. The memory device of claim 3, wherein:
the load elements are selected from diodes and diode connected transistors.

6. The memory device of claim 1, further including:
switch circuits coupled between the memory elements and the at least one program transistor and the erase load circuit, the switch circuits configured to
in a program operation, couple the at least one program transistor to the at least one memory element, and
in an erase operation, couple the erase load circuit to the at least one memory element.

7. The memory device of claim 6, wherein:
the switch circuits are further configured to
in the program operation, isolate the erase load circuit from the at least one memory element, and
in the erase operation, isolate the at least one program transistor from the at least one memory element.

8. The memory device of claim 1, wherein:
each memory element includes at least one solid electrolyte layer formed between an anode terminal and a cathode terminal.

9. A memory device, comprising:
a plurality of two-terminal conductive bridging random access memory (CBRAM) type memory elements;
at least one program transistor configured to enable a program current to flow through at least one memory element in response to the application of a program signal at its control terminal and a program bias voltage to the memory element; and
an erase load circuit that includes a plurality of load elements arranged in parallel with one another, the erase load circuit configured to enable an erase current to flow through at least one load element in a direction opposite to that of the program current, each load element including at least one two-terminal, diode-like element.

10. The memory device of claim 9, wherein:
each memory element includes at least one solid electrolyte layer formed between an anode terminal and a cathode terminal.

11. The memory device of claim 9, wherein:
in a program mode the program current flows through at least one element and the at least one program transistor is configured to have a first source/drain terminal coupled to at least one memory element and a second source/drain terminal coupled to a bias node.

12. The memory device of claim 11, wherein:
in an erase mode the erase current flows through the at least one element and
the at least one program transistor is configured to prevent current from flowing therethrough, and
the erase load circuit includes the load elements coupled between the at least one element and the bias node.

13. The memory device of claim 9, wherein:
the erase load circuit includes a plurality of load switches, each load switch being connected in series with one load element.

14. The memory device of claim 9, further including:
switch circuits coupled between the memory elements and the at least one program transistor and the erase load circuit, the switch circuits configured to
in a program operation, couple the at least one program transistor to the at least one memory element, and
in an erase operation, couple the erase load circuit to the at least one memory element.

15. The memory device of claim 9, wherein:
switch circuits coupled between the memory elements and the at least one program transistor and the erase load circuit, the switch circuits configured to
in a program operation, isolate the erase load circuit from the at least one memory element, and
in an erase operation, isolate the at least one program transistor from the at least one memory element.

16. A memory device, comprising:
a plurality of conductive bridging random access memory (CBRAM) type memory elements;
at least one program transistor configured to enable a program current to flow through at least one memory element in response to the application of a program signal at its control terminal and a program bias voltage to the memory element; and
an erase load circuit that includes a plurality of erase elements arranged in parallel with one another, the erase load circuit configured to enable an erase current to flow through at least one load element in a direction opposite to that of the program current, each erase selectively enabling a current path for at least a portion of the erase current.

17. The memory device of claim 16, wherein:
each erase element includes a switch element, each switch element being separately controlled to enable a desired erase current magnitude.

18. The memory device of claim 16, wherein:
each erase element includes a two-terminal diode-like element configured to enable current to flow therethrough when a potential across its two terminals exceeds a predetermined limit.

19. The memory device of claim 16, wherein:
each memory element includes at least one solid electrolyte layer formed between an anode terminal and a cathode terminal.

20. The memory device of claim 16, wherein:
the program current flows from the at least one memory element, through the program transistor to a first bias node; and
the erase current flows from the first bias node, through the erase load circuit, to the at least one memory element.

* * * * *